US012456588B2

(12) United States Patent
Noh et al.

(10) Patent No.: US 12,456,588 B2
(45) Date of Patent: Oct. 28, 2025

(54) METAL OXIDE NANOPARTICLE INK, METHOD OF PREPARING THE SAME, METAL OXIDE NANOPARTICLE THIN FILM MANUFACTURED USING THE SAME, AND PHOTOELECTRIC DEVICE USING THE SAME

(71) Applicants: KOREA UNIVERSITY RESEARCH AND BUSINESS FOUNDATION, Seoul (KR); RESEARCH & BUSINESS FOUNDATION SUNGKYUNKWAN UNIVERSITY, Suwon-si (KR)

(72) Inventors: Jun Hong Noh, Seoul (KR); Hyun Suk Jung, Seoul (KR); So Yeon Park, Goyang-si (KR); Se Jin Kim, Seoul (KR); Kyung Mun Yeom, Bucheon-si (KR)

(73) Assignees: KOREA UNIVERSITY RESEARCH AND BUSINESS FOUNDATION, Seoul (KR); RESEARCH & BUSINESS FOUNDATION SUNGKYUNKWAN UNIVERSITY, Suwon-si (KR)

( * ) Notice: Subject to any disclaimer, the term of this patent is extended or adjusted under 35 U.S.C. 154(b) by 0 days.

(21) Appl. No.: 18/101,591

(22) Filed: Jan. 26, 2023

(65) Prior Publication Data
US 2023/0170157 A1 Jun. 1, 2023

Related U.S. Application Data

(62) Division of application No. 17/038,461, filed on Sep. 30, 2020, now Pat. No. 11,600,451.

(30) Foreign Application Priority Data

Oct. 1, 2019 (KR) .................. 10-2019-0121484

(51) Int. Cl.
*H01G 9/20* (2006.01)
*C09D 1/04* (2006.01)
(Continued)

(52) U.S. Cl.
CPC ............. *H01G 9/2027* (2013.01); *C09D 1/04* (2013.01); *H01G 9/0036* (2013.01);
(Continued)

(58) Field of Classification Search
CPC .. H01G 9/2018; H01G 9/0036; H01G 9/2009; H01G 9/2072; H10K 50/135;
(Continued)

(56) References Cited

U.S. PATENT DOCUMENTS 8,242,181 B2 * 8/2012 Zhu .................. C09C 1/407
423/625

FOREIGN PATENT DOCUMENTS

CN 104900810 A * 9/2015
JP 2010-505763 A 2/2010
(Continued)

OTHER PUBLICATIONS

Islam et al. "NiOx Hole Transport Layer for Perovskite Solar Cells with Improved Stability and Reproducibility" ACS Omega 2017, 2, 5, 2291-2299.*
(Continued)

Primary Examiner — Robert S Walters, Jr.
(74) Attorney, Agent, or Firm — Hauptman Ham, LLP

(57) ABSTRACT

The present disclosure discloses metal oxide nanoparticle ink, a method of preparing the same, a metal oxide nanoparticle thin film manufactured using the same, and a photoelectric device using the same. The method of preparing metal oxide nanoparticle ink according to an embodiment of the present disclosure includes a step of, using a ligand solution including a metal oxide and an organic
(Continued)

ligand, synthesizing a first nanoparticle that is a metal oxide nanoparticle surrounded with the organic ligand; a step of preparing a dispersion solution by dispersing the first nanoparticle in a solvent; a step of preparing a second nanoparticle by mixing the dispersion solution and a pH-adjusted alcohol solvent and then performing ultrasonication treatment to remove the organic ligand surrounding the first nanoparticle; and a step of preparing metal oxide nanoparticle ink by dispersing the second nanoparticle in a dispersion solvent.

2 Claims, 8 Drawing Sheets

(51) Int. Cl.
*H01G 9/00* (2006.01)
*H10K 30/57* (2023.01)
*H10K 50/135* (2023.01)
*H10K 50/15* (2023.01)
*H10K 71/15* (2023.01)
*H10K 30/50* (2023.01)
*H10K 102/00* (2023.01)

(52) U.S. Cl.
CPC ......... *H01G 9/2009* (2013.01); *H01G 9/2018* (2013.01); *H01G 9/2072* (2013.01); *H10K 30/57* (2023.02); *H10K 50/135* (2023.02); *H10K 50/15* (2023.02); *H10K 71/15* (2023.02); *H10K 30/50* (2023.02); *H10K 2102/00* (2023.02); *H10K 2102/331* (2023.02); *H10K 2102/351* (2023.02)

(58) Field of Classification Search
CPC ........ H10K 30/57; H10K 71/15; H10K 50/15; H10K 2102/351; H10K 2102/00; H10K 2102/331; C09D 1/04
See application file for complete search history.

(56) References Cited

FOREIGN PATENT DOCUMENTS

| KR | 10-2016-0147526 A | 12/2016 |
| KR | 10-1739517 B1 | 5/2017 |
| KR | 10-2017-0102206 A | 9/2017 |
| KR | 10-1795774 B1 | 11/2017 |
| KR | 10-1894413 B1 | 9/2018 |
| KR | 10-2048884 B1 | 11/2019 |

OTHER PUBLICATIONS

Wieneke et al. "Systematic Investigation of Dispersions of Unmodified Inorganic Nanoparticles in Organic Solvents with Focus on the Hansen Solubility Parameters" Ind. Eng. Chem. Res. 2012, 51, 1, 327-334.*

He et al. "Ligand-Free, Highly Dispersed NiOx Nanocrystal for Efficient, Stable, Low-Temperature Processable Perovskite Solar Cells" RRL Solar vol. 2, Issue 4, Apr. 2018 (Year: 2018).*

Abstract and Supporting Information for Chen et al. "A Tailored Nickel Oxide Hole-Transporting Layer to Improve the Long-Term Thermal Stability of Inorganic Perovskite Solar Cells" RRL Solar, vol. 3, Issue 11, 1900346, first published Sep. 2019 (Year: 2019).*

Venkatesan et al. "Semiconductive poly[N1,N4-bis(thiophen-2-ylmethylene)benzene-1,4-diamine]-nickel oxide nanocomposite based ethanol sensor" Journal of Applied Polymer Science, vol. 139, Issue 9, p. 45918. Oct. 2017 (Year: 2017).*

Korean Notice of Allowance issued on Feb. 22, 2021, in connection with the Korean Patent Application No. 10-2019-0121484 citing the above reference(s).

Kohler et al., "A Bifunctional Poly(ethylene glycol) Silane Immobilized on Metallic Oxide-Based Nanoparticles for Conjugation with Cell Targeting Agents," J. Am. Chem. Soc. 2004, 126, 7206-7211, 6 pages.

* cited by examiner

METAL OXIDE NANOPARTICLE INK, METHOD OF PREPARING THE SAME, METAL OXIDE NANOPARTICLE THIN FILM MANUFACTURED USING THE SAME, AND PHOTOELECTRIC DEVICE USING THE SAME

CROSS-REFERENCE TO RELATED APPLICATION

This application is a Divisional application of U.S. patent application Ser. No. 17/038,461, filed on Sep. 30, 2020, which claims priority to Korean Patent Application No. 10-2019-0121484, filed on Oct. 1, 2019 in the Korean Intellectual Property Office, the disclosure of which are incorporated herein by reference in their entireties.

BACKGROUND OF THE DISCLOSURE

Field of the Disclosure

The present disclosure relates to metal oxide nanoparticle ink, a method of preparing the same, a metal oxide nanoparticle thin film manufactured using the same, and a photoelectric device using the same.

Description of the Related Art

Organic/inorganic complex perovskite solar cells, to which a halide light absorber having a perovskite crystal structure of $AMX_3$ is applied, have a high energy conversion efficiency of about 25%, and thus, are attracting attention as a next-generation solar cell.

In particular, since such a perovskite solar cell may be manufactured through a solution process at a low temperature of 200° C. or less, the perovskite solar cell may have advantages such as high efficiency, low cost, and weight reduction, and thus, is considered as a promising next-generation solar cell.

However, to date, perovskite solar cells exhibiting high efficiency have been developed based on organic hole transport materials.

To overcome the inherent limitations of the organic hole transport materials such as low charge mobility, additives such as lithium bis(trifluoromethanesulfonyl)imide (Li-TFSI) and TBP (4-tert-butylpyridine) are used, but use of these additives may negatively affect long-term stability.

A perovskite solar cell including such an organic hole transport layer exhibits high efficiency, but is very vulnerable to external environmental factors such as moisture and heat, which shortens the lifespan of a device. In this way, shortening the lifespan of the device makes commercialization thereof difficult.

In addition, limitations on mass synthesis and uniformity of organic hole transport materials may act as obstacles to commercialization of perovskite solar cells.

To secure stability and mass production of a device, for example, a method of using an inorganic material-based metal oxide hole transport material, which is resistant to oxygen, moisture, and heat, has high charge mobility without additives, and can be mass-produced at low cost, as a charge transport layer on a perovskite thin film has been studied.

However, uniform formation of a crystalline metal oxide thin film on a perovskite halide thin film through a solution process is difficult for the following reasons.

First, to form a crystalline oxide thin film, high-temperature heat treatment at temperatures above several hundred degrees Celsius is usually required.

However, due to the low thermal decomposition temperature (less than 300° C.) of perovskite materials, when a crystalline oxide thin film is formed on a perovskite thin film through a solution process, high-temperature heat treatment is not allowed.

Second, as another method of forming a crystalline oxide thin film through a solution process, a substrate is coated with ink prepared by dispersing crystallized nanoparticles.

In this case, to form a uniform crystalline metal oxide nanoparticle thin film, nanoparticle-dispersed ink including a solvent that does not damage a perovskite thin film must be used, and heat treatment must be performed at a low temperature.

At this time, a uniform and dense film having a thickness of several tens to several hundreds of nanometers can only be formed when metal oxide nanoparticles are uniformly dispersed in ink without aggregation.

For these reasons, when a thin film is formed on a perovskite thin film through a conventional wet process used to form a crystalline metal oxide thin film, high-temperature heat treatment and high-temperature sintering cannot be performed.

In addition, in the case of a method of obtaining amorphous nanoparticles through a conventional wet process and then dispersing the nanoparticles in a solvent by crystallization through high-temperature heat treatment, due to necking and coagulation of nanoparticles upon high-temperature heat treatment, preparation of ink having high dispersibility is difficult. Accordingly, a coating method using ink not having high dispersibility cannot be applied to a process of forming a uniform charge transport layer on a perovskite thin film. A non-uniform charge transport layer causes non-uniformity in the final performance of a device. In particular, in modularization of a large area for commercialization, the non-uniform charge transport layer may cause a fatal problem that degrades the performance of the device.

In addition, in the case of metal oxide nanoparticles, a polar solvent is generally used as a solvent for ink that is dispersed in an aqueous or polar solvent such as $H_2O$. However, the polar solvent may cause decomposition of a perovskite halide.

A method of synthesizing metal oxide nanoparticles including ligands to obtain highly dispersible metal oxide nanoparticles in a nonpolar solvent (mainly an organic solvent) that does not decompose perovskite may be used. However, when such a method is used to fabricate a photoelectric conversion device, charge transport may be impossible due to the ligand serving as an insulator.

Accordingly, a process of removing these ligands is required, but removal of the ligands leads to deterioration in the dispersibility of particles, which makes it difficult to manufacture a uniform thin film having a thickness of several tens or several hundreds of nanometers.

RELATED ART DOCUMENTS

Patent Documents

Korean Patent No. 10-1739517, "METHOD OF MANUFACTURING THIN FILM INCLUDING NICKEL OXIDE NANOPARTICLES AND SOLAR CELL USING THE SAME"

Korean Patent No. 10-1795774, "SOLAR CELL USING PEROVSKITE-NICKEL OXIDE COMPOSITE MATERIAL AND METHOD OF MANUFACTURING THE SAME"

SUMMARY OF THE DISCLOSURE

Therefore, the present disclosure has been made in view of the above problems, and it is an object of the present disclosure to provide metal oxide nanoparticle ink, a method of preparing the same, and a photoelectric device using the same. According to the present disclosure, a metal oxide nanoparticle without an organic ligand is prepared and then dispersed in a dispersion solvent to prepare the highly dispersible metal oxide nanoparticle ink.

It is another object of the present disclosure to provide metal oxide nanoparticle ink, a method of preparing the same, and a photoelectric device using the same. According to the present disclosure, when the metal oxide nanoparticle ink including a crystallized metal oxide nanoparticle is prepared, and is applied to a photoelectric device, crystallization is possible at low temperature without heat treatment.

It is still another object of the present disclosure to provide metal oxide nanoparticle ink, a method of preparing the same, and a photoelectric device using the same. According to the present disclosure, when the metal oxide nanoparticle ink including a metal oxide nanoparticle without an organic ligand is prepared and applied to a photoelectric device, deterioration in electrical properties of the photoelectric device due to the insulating organic ligand may be prevented.

It is still another object of the present disclosure to provide metal oxide nanoparticle ink, a method of preparing the same, and a photoelectric device using the same. According to the present disclosure, when the highly dispersible metal oxide nanoparticle ink is prepared and a charge transport layer is applied to a photoelectric device, various types of metal oxide nanoparticles may be included compared to the prior art.

It is still another object of the present disclosure to provide metal oxide nanoparticle ink, a method of preparing the same, and a photoelectric device using the same. According to the present disclosure, when the metal oxide nanoparticle ink including a dispersion solvent and a metal oxide nanoparticle without an organic ligand is prepared and used, a charge transport layer may be formed without damage to the upper surface of a photoactive layer composed of a perovskite compound.

It is still another object of the present disclosure to provide metal oxide nanoparticle ink, a method of preparing the same, and a photoelectric device using the same. According to the present disclosure, by applying the metal oxide nanoparticle ink to a photoelectric device, a uniform and dense thin film may be formed without damage to a photoactive layer composed of a perovskite compound.

It is yet another object of the present disclosure to provide metal oxide nanoparticle ink, a method of preparing the same, and a photoelectric device using the same. According to the present disclosure, when applying the metal oxide nanoparticle ink to a photoelectric device, the stability of the photoelectric device may be excellent.

In accordance with one aspect of the present disclosure, provided is a method of preparing metal oxide nanoparticle ink, the method including synthesizing, using a ligand solution including a metal oxide precursor and an organic ligand, a first nanoparticle that is a metal oxide nanoparticle surrounded with the organic ligand; preparing a dispersion solution by dispersing the first nanoparticle in a solvent; preparing a second nanoparticle by mixing the dispersion solution and a pH-adjusted alcohol solvent and then performing ultrasonication treatment to remove the organic ligand surrounding the first nanoparticle; and preparing metal oxide nanoparticle ink by dispersing the second nanoparticle in a dispersion solvent.

According to the method of preparing metal oxide nanoparticle ink according to an embodiment of the present disclosure, the ligand solution may include at least one of oleylamine, a methyl group, an ethyl group, a propyl group, a butyl group, a pentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosacyl group, and an isomer thereof.

According to the method of preparing metal oxide nanoparticle ink according to an embodiment of the present disclosure, the pH-adjusted alcohol solvent may include sodium acetate or potassium acetate.

According to the method of preparing metal oxide nanoparticle ink according to an embodiment of the present disclosure, the pH-adjusted alcohol solvent may have a pH value of 5 to 6.

According to the method of preparing metal oxide nanoparticle ink according to an embodiment of the present disclosure, the ultrasonication treatment may be performed for 30 minutes to 60 minutes.

In accordance with another aspect of the present disclosure, provided is metal oxide nanoparticle ink including a metal oxide nanoparticle from which an organic ligand has been removed; and a dispersion solvent for dispersing the metal oxide nanoparticle, wherein the dispersion solvent includes a solvent satisfying Equations 1 and 2 below representing a Hansen solubility sphere:

$$R_a^2 = 4(\delta D_2 - \delta D_1)^2 + 1(\delta P_2 - \delta P_1)^2 + 1(\delta H_2 - \delta H_1)^2, \quad \text{[Equation 1]}$$

wherein Ra represents a distance (radius) from a solvent to a volumetric center of a solute, Subscript 1 represents a solvent, Subscript 2 represents a solute, $\delta D$ represents a dispersion solubility parameter, $\delta P$ represents a polar solubility parameter, and $\delta H$ represents a hydrogen-binding solubility parameter; and $$\text{Relative energy difference (RED)} = R_a/R_0, \quad \text{[Equation 2]}$$

wherein Ra represents a distance (radius) from a solvent to a volumetric center of a solute, and $R_0$ represents an interaction distance (radius of Hansen solubility sphere) between a solvent and a solute including the solvent for dissolving or dispersing the solute.

According to the metal oxide nanoparticle ink according to an embodiment of the present disclosure, the dispersion solvent may include at least one of water, acetone, ethanol, butanol, isopropanol, methanol, hexanol, hexane, cyclohexane, toluene, chlorobenzene, benzene, chloroform, and diethyl ether.

According to the metal oxide nanoparticle ink according to an embodiment of the present disclosure, the dispersion solvent may include a polar solvent and a nonpolar solvent. In this case, the polar and nonpolar solvents may be mixed in a volume ratio of 1:9 to 9:1.

According to the metal oxide nanoparticle ink according to an embodiment of the present disclosure, the metal oxide nanoparticle may be selected from the group consisting of nickel oxide (NiO), tin oxide ($SnO_2$), titanium dioxide ($TiO_2$), zinc oxide (ZnO), copper(II) oxide (CuO), cobalt(II) oxide (CoO), indium oxide ($In_2O_3$), tungsten oxide ($WO_3$), magnesium oxide (MgO), calcium oxide (CaO), lanthanum oxide ($La_2O_3$), neodymium oxide ($Nd_2O_3$), yttrium oxide ($Y_2O_3$), cerium oxide ($CeO_2$), lead oxide (PbO), zirconium oxide ($ZrO_2$), iron oxide ($Fe_2O_3$), bismuth oxide ($Bi_2O_3$), vanadium pentoxide ($V_2O_5$), vanadium(V) oxide ($VO_2$), niobium pentoxide ($Nb_2O_5$), cobalt(II) cobalt(IV) oxide ($Co_3O_4$), aluminum oxide ($Al_2O_3$), and combinations thereof.

According to the metal oxide nanoparticle ink according to an embodiment of the present disclosure, the metal oxide nanoparticle may have a diameter of 3 nm to 10 nm.

In accordance with still another aspect of the present disclosure, provided is a metal oxide nanoparticle thin film including a metal oxide nanoparticle from which an organic ligand has been removed, wherein the metal oxide nanoparticle thin film is uniformly formed on a photoactive layer of a photoelectric device through application by a solution process.

According to the metal oxide nanoparticle thin film according to an embodiment of the present disclosure, the metal oxide nanoparticle thin film may have a thickness of 10 nm to 1,000 nm.

In accordance with yet another aspect of the present disclosure, provided is a photoelectric device including a first electrode formed on a substrate; a first semiconductor layer formed on the first electrode; a perovskite photoactive layer that is formed on the first semiconductor layer and includes a perovskite compound represented by Chemical Formula below; a second semiconductor layer that is formed on the perovskite photoactive layer and is formed of the metal oxide nanoparticle thin film of the present disclosure; and a second electrode formed on the second semiconductor layer:

$$AMX_3,$$ [Chemical Formula]

wherein A represents a monovalent cation, M represents a divalent metal cation, and X represents a halogen anion.

According to the photoelectric device according to an embodiment of the present disclosure, the metal oxide nanoparticle may be selected from the group consisting of nickel oxide (NiO), tin oxide ($SnO_2$), titanium dioxide ($TiO_2$), zinc oxide (ZnO), copper(II) oxide (CuO), cobalt(II) oxide (CoO), indium oxide ($In_2O_3$), tungsten oxide ($WO_3$), magnesium oxide (MgO), calcium oxide (CaO), lanthanum oxide ($La_2O_3$), neodymium oxide ($Nd_2O_3$), yttrium oxide ($Y_2O_3$), cerium oxide ($CeO_2$), lead oxide (PbO), zirconium oxide ($ZrO_2$), iron oxide ($Fe_2O_3$), bismuth oxide ($Bi_2O_3$), vanadium pentoxide ($V_2O_5$), vanadium(V) oxide ($VO_2$), niobium pentoxide ($Nb_2O_5$), cobalt(II) cobalt(IV) oxide ($Co_3O_4$), aluminum oxide ($Al_2O_3$), and combinations thereof.

According to the photoelectric device according to an embodiment of the present disclosure, the photoelectric device may be any one of a solar cell, a tandem solar cell, and a light-emitting device.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

Figure 1:
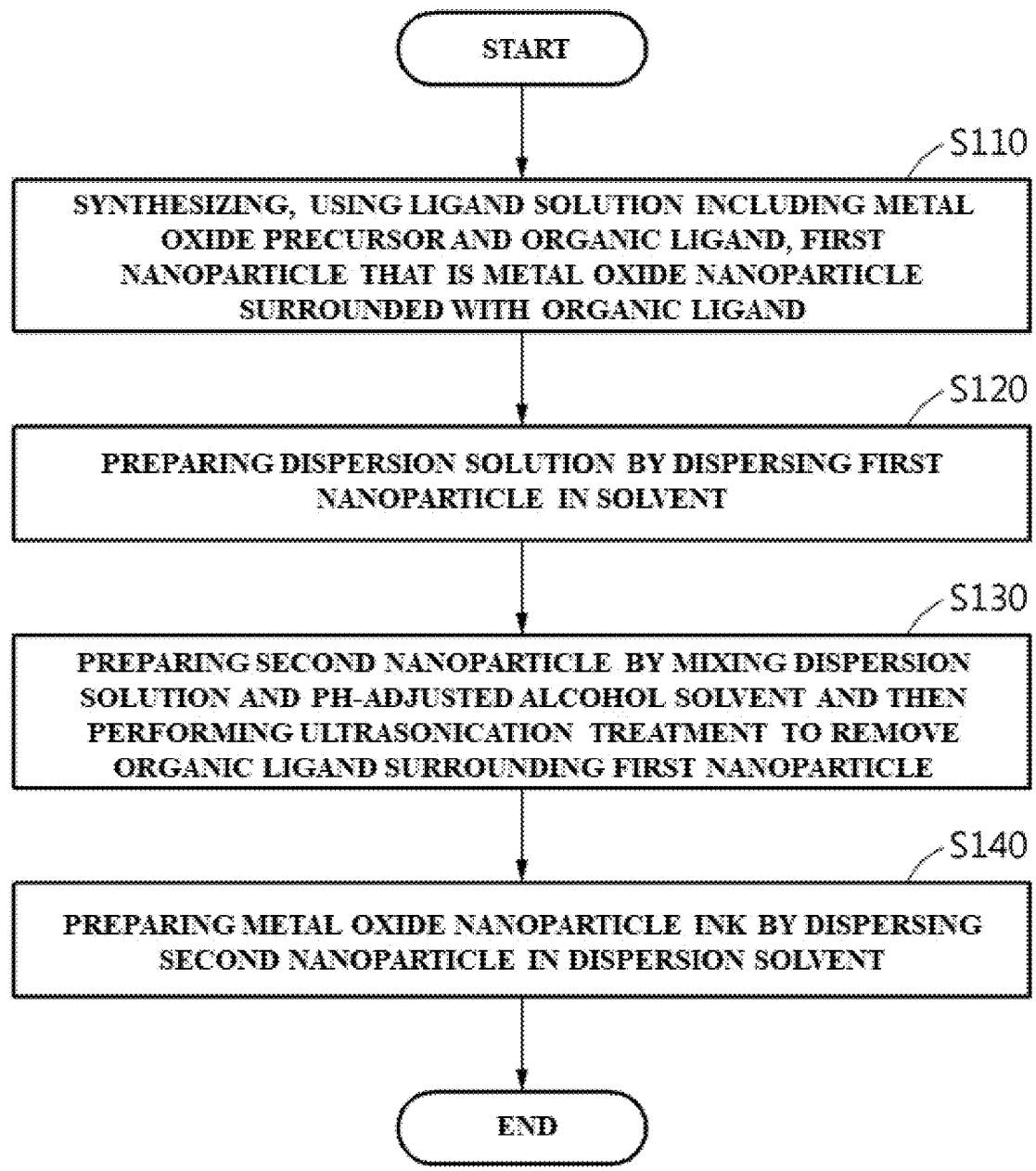
FIG. 1 is a flowchart showing a method of preparing metal oxide nanoparticle ink according to an embodiment of the present disclosure.

The present disclosure will now be described more fully with reference to the accompanying drawings and contents disclosed in the drawings. However, the present disclosure should not be construed as limited to the exemplary embodiments described herein.

The terms used in the present specification are used to explain a specific exemplary embodiment and not to limit the present inventive concept. Thus, the expression of singularity in the present specification includes the expression of plurality unless clearly specified otherwise in context. It will be further understood that the terms "comprise" and/or "comprising", when used in this specification, specify the presence of stated components, steps, operations, and/or elements, but do not preclude the presence or addition of one or more other components, steps, operations, and/or elements thereof.

It should not be understood that arbitrary aspects or designs disclosed in "embodiments", "examples", "aspects", etc. used in the specification are more satisfactory or advantageous than other aspects or designs.

In addition, the expression "or" means "inclusive or" rather than "exclusive or". That is, unless otherwise mentioned or clearly inferred from context, the expression "x uses a or b" means any one of natural inclusive permutations.

In addition, as used in the description of the disclosure and the appended claims, the singular form "a" or "an" is intended to include the plural forms as well, unless context clearly indicates otherwise.

Although terms used in the specification are selected from terms generally used in related technical fields, other terms may be used according to technical development and/or due to change, practices, priorities of technicians, etc. Therefore, it should not be understood that terms used below limit the technical spirit of the present disclosure, and it should be understood that the terms are exemplified to describe embodiments of the present disclosure.

In addition, some of the terms used herein may be arbitrarily chosen by the present applicant. In this case, these terms are defined in detail below. Accordingly, the specific terms used herein should be understood based on the unique meanings thereof and the whole context of the present disclosure.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In addition, in the following description of the present disclosure, a detailed description of known functions and configurations incorporated herein will be omitted when it may make the subject matter of the present disclosure unclear. The terms used in the specification are defined in consideration of functions used in the present disclosure, and can be changed according to the intent or conventionally used methods of clients, operators, and users. Accordingly, definitions of the terms should be understood on the basis of the entire description of the present specification.

Conventionally, in a photoelectric device including a perovskite compound, an organic material was used as a p-type material formed on the upper surface of a perovskite photoactive layer.

The conventional organic material may improve the electrical efficiency of a photoelectric device, but has a defect in terms of stability. Thus, a technology of using an inorganic material instead of the organic material has been proposed.

According to the technology of using an inorganic material, a solution prepared by dispersing inorganic material particles surrounded by ligands in a nonpolar solvent is applied to the upper surface of a perovskite photoactive layer.

In this case, the upper surface of the perovskite photoactive layer may be damaged, and the electrical properties of a photoelectric device may be degraded due to improvement in insulating properties by the ligands.

To solve these problems of the prior art, the present disclosure provides metal oxide nanoparticle ink according to an embodiment of the present disclosure and a method of preparing the same. According to the present disclosure, when metal oxide nanoparticle ink is prepared, a metal oxide, which is an inorganic material, is used. In addition, the prepared metal oxide nanoparticle ink is applied to the upper surface of a perovskite photoactive layer to form a charge transport layer. Thereby, without damage to the upper surface of the perovskite photoactive layer, a photoelectric device having electrical efficiency equal to that of a conventional photoelectric device using an organic material may be manufactured.

Hereinafter, metal oxide nanoparticle ink according to an embodiment of the present disclosure, a method of preparing the same, a metal oxide nanoparticle thin film manufactured using the same, and a photoelectric device using the same will be described with reference to the accompanying drawings.

FIG. 1 is a flowchart showing a method of preparing metal oxide nanoparticle ink according to an embodiment of the present disclosure.

Referring to FIG. 1, a method of preparing metal oxide nanoparticle ink according to an embodiment of the present disclosure includes step S110 of, using a ligand solution including a metal oxide and an organic ligand, synthesizing a first nanoparticle that is a metal oxide nanoparticle surrounded with the organic ligand; step S120 of preparing a dispersion solution by dispersing the first nanoparticle in a solvent; step S130 of preparing a second nanoparticle by mixing the dispersion solution and a pH-adjusted alcohol solvent and then performing ultrasonication treatment to remove the organic ligand surrounding the first nanoparticle; and step S140 of preparing metal oxide nanoparticle ink by dispersing the second nanoparticle in a dispersion solvent.

In the description of the present disclosure, the ligand solution refers to a solution including an organic ligand.

In addition, in the description of the present disclosure, the metal oxide nanoparticle is a spherical particle having a nanometer-scale diameter formed of a metal oxide.

In addition, in the description of the present disclosure, the first nanoparticle refers to a metal oxide nanoparticle surrounded by an organic ligand.

In addition, in the description of the present disclosure, the solvent is a solvent for dispersing the first nanoparticle.

In addition, in the description of the present disclosure, the dispersion solution refers to a solution prepared by dispersing the first nanoparticle in a solvent.

In addition, in the description of the present disclosure, the alcohol solvent refers to a solvent composed of an alcohol that is an organic compound including a hydroxyl group (—OH) bonded to a carbon atom, such as methanol, ethanol, and butanol.

In addition, in the description of the present disclosure, the dispersion solvent refers to a solvent for dispersing the second nanoparticle.

In addition, in the description of the present disclosure, the second nanoparticle refers to a metal oxide nanoparticle obtained by removing the organic ligand surrounding the first nanoparticle.

In step S110, the metal oxide precursor and the ligand solution may be mixed to prepare the metal oxide nanoparticle surrounded by the organic ligand having a long chain.

Specifically, in step S110, the metal oxide precursor and the ligand solution may be mixed, and then may be reacted in an autoclave to prepare the metal oxide nanoparticle surrounded by the organic ligand.

The metal oxide precursor is a precursor for preparing a metal oxide nanoparticle.

According to an embodiment of the present disclosure, to prepare the second nanoparticle composed of nickel oxide (NiO), the metal oxide precursor may include at least one of nickel(II) acetylacetonate (Ni($C_5H_7O_2$)$_2$), nickel chloride (NiCl$_2$), nickel sulfate (NiSO$_4$), nickel acetate (Ni(OCOCH$_3$)$_2$), nickel nitrate (Ni(NO$_3$)$_2$), and nickel hydroxide (Ni(OH)$_2$), without being limited thereto.

The ligand solution refers to a solution including an organic ligand. According to an embodiment of the present disclosure, the ligand solution may be a solution including an amine ligand, such as oleylamine, or an alkyl group.

Specifically, the ligand solution may include an alkyl group having two or more carbon atoms, and the alkyl group having two or more carbon atoms may have a double bond or a triple bond between carbon atoms.

For example, the ligand solution may include at least one of amine ligands, such as oleylamine, and alkyl groups including a methyl group, an ethyl group, a propyl group, a butyl group, a pentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosacyl group, and an isomer thereof, without being limited thereto.

The metal oxide nanoparticle may be a spherical particle formed of a metal oxide which is an inorganic material.

According to an embodiment of the present disclosure, in step S110, since nickel(II) acetylacetonate is used as a metal oxide, the synthesized first nanoparticle may be a metal oxide nanoparticle formed of nickel oxide (NiO) and surrounded by an organic ligand.

In step S120, the dispersion solution in which the first nanoparticle is dispersed may be prepared.

The solvent may be a material having high dispersibility for the first nanoparticle.

According to an embodiment of the present disclosure, the solvent is a nonpolar solvent having a dielectric constant of 15 or less, and may include, for example, at least one of hexane, cyclohexane, toluene, chlorobenzene, benzene, chloroform, and diethyl ether, without being limited thereto.

In step S130, the second nanoparticle in the form of a metal oxide nanoparticle may be prepared by removing the organic ligand from the first nanoparticle.

Since the organic ligand has insulating properties, the organic ligand may cause decrease in the electrical efficiency of a photoelectric device to be described later, and thus a process of removing the organic ligand from the first nanoparticle is required.

In step S130, to remove the organic ligand from the first nanoparticle, the pH-adjusted alcohol solvent may be added to the dispersion solution, and then ultrasonication treatment may be performed.

In general, since the number of hydroxyl groups (—OH) contained in an alcohol is different depending on alcohol solvents, alcohol solvents have different pH values.

Accordingly, in the description of the present disclosure, the pH-adjusted alcohol solvent is an alcohol solvent, the pH value of which is adjusted to 5 to 6.

In this case, to adjust the pH of the alcohol solvent to 5 to 6, the pH-adjusted alcohol solvent may include a salt material with weak acidic properties, such as sodium acetate or potassium acetate.

In step S130, to prepare the second nanoparticle, the pH-adjusted alcohol solvent may be added to the dispersion solution, and then ultrasonication treatment may be performed for 30 minutes to 60 minutes to remove the organic ligand from the first nanoparticle.

According to an embodiment of the present disclosure, step S130 may further include a step of washing the second nanoparticle.

The second nanoparticle may be washed with acetone to additionally remove organic ligands remaining on the surface of the second nanoparticle.

In addition, according to an embodiment of the present disclosure, step S130 may further include a step of freezing and drying the washed second nanoparticle.

In step S140, the metal oxide nanoparticle ink is prepared by dispersing, in the dispersion solvent, the second nanoparticle which is a metal oxide nanoparticle from which the organic ligand has been removed.

Since the second nanoparticle has low dispersibility in a solvent contained in the dispersion solution for dispersing the first nanoparticle, in step S140, to increase the dispersibility of the second nanoparticle, the second nanoparticle may be dispersed in a dispersion solvent different from the solvent contained in the dispersion solution for dispersing the first nanoparticle.

The dispersion solvent may include a solvent satisfying Equations 1 and 2 below representing a Hansen solubility sphere.

$$R_a^2 = 4(\delta D_2 - \delta D_1)^2 + 1(\delta P_2 - \delta P_1)^2 + 1(\delta H_2 - \delta H_1)^2 \quad \text{[Equation 1]}$$

In Equation 1, Ra represents a distance (radius) from a solvent to the volumetric center of a solute, Subscript 1 represents a solvent, Subscript 2 represents a solute, $\delta D$ represents a dispersion solubility parameter, $\delta P$ represents a polar solubility parameter, and $\delta H$ represents a hydrogen-binding solubility parameter.

$$\text{Relative energy difference (RED)} = Ra/R_0 \quad \text{[Equation 2]}$$

In Equation 2, Ra represents the distance (radius) from a solvent to the volumetric center of a solute, and $R_0$ represents the interaction distance (radius of Hansen solubility sphere) between a solvent and a solute including the solvent for dissolving or dispersing the solute.

In this case, in the case of RED <1, the solute or the particle may be easily dissolved or dispersed in the solvent. In the case of RED>1, the solute or the particle may not be dissolved or dispersed in the solvent.

For example, when the NiO nanoparticle (metal oxide nanoparticle of Example 1) has a $\delta D$ value of 16.9 MPa$^{1/2}$, a $\delta P$ value of 7 MPa$^{1/2}$, a $\delta H$ value of 9.3 MPa$^{1/2}$, and a $R_0$ value of 4 MPa½, and the dispersion solvent has a $\delta D$ value of 15 MPa$^{1/2}$ to 18 MPa$^{1/2}$, a $\delta P$ value of 3 MPa$^{1/2}$ to 6 MPa$^{1/2}$, and a $\delta H$ value of 7 MPa$^{1/2}$ to 15 MPa$^{1/2}$, the NiO nanoparticle (metal oxide nanoparticle of Example 1) may be dispersed.

Accordingly, when the solubility parameter of a mixed solvent or a single solvent used as the dispersion solvent satisfies the above-described conditions, the metal oxide nanoparticle may be dispersed.

Accordingly, when the dispersion solvent prepared by mixing 1-butanol and chloroform in a volume ratio of 1:1 exhibits solubility parameters, wherein $\delta D$ is 16.9 MPa$^{1/2}$, $\delta P$ is 4.45 MPa$^{1/2}$, and $\delta H$ is 10.75 MPa$^{1/2}$, the NiO nanoparticle of Example 1 (metal oxide nanoparticle of Example 1) may be dispersed.

In addition, when hexanol exhibits solubility parameters, wherein $\delta D$ is 15.9 MPa$^{1/2}$, is 5.8 MPa$^{1/2}$, and $\delta H$ is 12.5 MPa$^{1/2}$, the NiO nanoparticle (metal oxide nanoparticle of Example 1) may be dispersed.

According to an embodiment of the present disclosure, the dispersion solvent may include at least one of water, acetone, ethanol, butanol, isopropanol, methanol, hexanol, hexane, cyclohexane, toluene, chlorobenzene, benzene, chloroform, and diethyl ether, without being limited thereto.

In addition, to increase the dispersibility of the second nanoparticle, the dispersion solvent may be prepared by mixing a polar solvent and a nonpolar solvent.

The polar solvent may be a common polar solvent having a dielectric constant of 15 or more, and according to an embodiment of the present disclosure, the polar solvent may include at least one of water, acetone, ethanol, butanol, isopropanol, methanol, and hexanol. However, any solvent having polarity may be used as the polar solvent without particular limitation.

The nonpolar solvent may be a common nonpolar solvent having a dielectric constant 15 or less, and according to an embodiment of the present disclosure, the nonpolar solvent may include at least one of hexane, cyclohexane, toluene, chlorobenzene, benzene, chloroform, and diethyl ether. However, any nonpolar solvent may be used as the nonpolar solvent without particular limitation.

The dispersion solvent may be prepared by mixing the polar solvent and the nonpolar solvent. For example, the dispersion solvent may be prepared by mixing the polar solvent and the nonpolar solvent in a volume ratio of 1:9 to 9:1.

Since the second nanoparticles have no ligand, repulsive force may be generated between the second nanoparticles.

Due to the repulsive force between the second nanoparticles, the dispersibility of the second nanoparticles in the dispersion solvent may be increased.

Accordingly, the metal oxide nanoparticle ink prepared in step S140 may include the metal oxide nanoparticle from which the organic ligand has been removed and the dispersion solvent for dispersing the metal oxide nanoparticle.

When the metal oxide nanoparticle ink is prepared using the method of preparing metal oxide nanoparticle ink according to an embodiment of the present disclosure, since the dispersion solvent prepared by mixing the polar solvent and the nonpolar solvent is used, the dispersibility of the metal oxide nanoparticle may be significantly increased.

Accordingly, when the metal oxide nanoparticle ink is applied to a photoelectric device to be described later, the upper surface of a photoactive layer may be uniformly coated with the metal oxide nanoparticle ink.

Hereinafter, the metal oxide nanoparticle ink according to an embodiment of the present disclosure and a process of preparing the metal oxide nanoparticle ink shown in FIG. 2 will be described.

Figure 2:
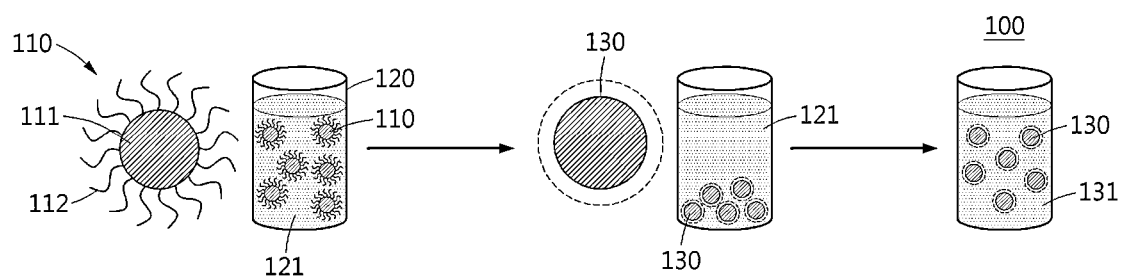
FIG. 2 is a schematic diagram showing a process of preparing metal oxide nanoparticle ink according to an embodiment of the present disclosure.

Since the configuration shown in FIG. 2 includes all of the components described in FIG. 1, repeated description thereof will be omitted.

FIG. 2 is a schematic diagram showing a process of preparing metal oxide nanoparticle ink according to an embodiment of the present disclosure.

Referring to FIG. 2, first, a first nanoparticle 110 that is a metal oxide nanoparticle 111 surrounded by an organic ligand 112 is dispersed in a solvent 121 to prepare a dispersion solution 120.

In this case, the dispersibility of the first nanoparticle 110 may be increased due to the solvent 121.

Then, a pH-adjusted alcohol solvent is added to the dispersion solution 120, and then ultrasonication treatment is performed to remove the organic ligand 112 from the first nanoparticle 110. Thereby, a second nanoparticle 130 is prepared.

In this case, the second nanoparticle 130 is the metal oxide nanoparticle 111 from which the organic ligand 112 is removed, and the dispersibility of the second nanoparticle 130 in the solvent 121 may be low.

Next, the obtained second nanoparticle 130 is dispersed in a dispersion solvent 131 to prepare metal oxide nanoparticle ink 100.

As a result, the metal oxide nanoparticle ink 100 according to an embodiment of the present disclosure includes the second nanoparticle 130, i.e., the metal oxide nanoparticle 111 from which the organic ligand 112 is removed, and the dispersion solvent 131.

In this case, the dispersion solvent 131 includes a solvent satisfying Equations 1 and 2 below representing a Hansen solubility sphere.

$$R_a^2 = 4(\delta D_2 - \delta D_1)^2 + 1(\delta P_2 - \delta P_1)^2 + 1(\delta H_2 - \delta H_1)^2 \quad \text{[Equation 1]}$$

In Equation 1, Ra represents a distance (radius) from a solvent to the volumetric center of a solute, Subscript 1 represents a solvent, Subscript 2 represents a solute, $\delta D$ represents a dispersion solubility parameter, $\delta P$ represents a polar solubility parameter, and $\delta H$ represents a hydrogen-binding solubility parameter.

$$\text{Relative energy difference (RED)} = R_a/R_0 \quad \text{[Equation 2]}$$

In Equation 2, Ra represents the distance (radius) from a solvent to the volumetric center of a solute, and $R_0$ represents the interaction distance (radius of Hansen solubility sphere) between a solvent and a solute including the solvent for dissolving or dispersing the solute.

In this case, in the case of RED <1, the solute or the particle may be easily dissolved or dispersed in the solvent. In the case of RED>1, the solute or the particle may not be dissolved or dispersed in the solvent.

According to an embodiment of the present disclosure, the dispersion solvent 131 is prepared by mixing a polar solvent and a nonpolar solvent. The description thereof has been described in FIG. 1, and thus repeated description thereof will be omitted.

The metal oxide nanoparticle 111 according to an embodiment of the present disclosure may be formed of an inorganic material selected from the group consisting of nickel oxide (NiO), tin oxide ($SnO_2$), titanium dioxide ($TiO_2$), zinc oxide (ZnO), copper(II) oxide (CuO), cobalt(II) oxide (CoO), indium oxide ($In_2O_3$), tungsten oxide ($WO_3$), magnesium oxide (MgO), calcium oxide (CaO), lanthanum oxide ($La_2O_3$), neodymium oxide ($Nd_2O_3$), yttrium oxide ($Y_2O_3$), cerium oxide ($CeO_2$), lead oxide (PbO), zirconium oxide ($ZrO_2$), iron oxide ($Fe_2O_3$), bismuth oxide ($Bi_2O_3$), vanadium pentoxide ($V_2O_5$), vanadium(V) oxide ($VO_2$), niobium pentoxide ($Nb_2O_5$), cobalt(II) cobalt(IV) oxide ($Co_3O_4$), aluminum oxide ($Al_2O_3$), and combinations thereof, and may be a spherical particle having a nanometer-scale diameter.

According to an embodiment of the present disclosure, the metal oxide nanoparticle 111 may have a diameter of 3 nm to 10 nm.

The metal oxide nanoparticle 111 according to an embodiment of the present disclosure may be efficiently dispersed in the metal oxide nanoparticle ink 100 up to a concentration of 50 mg/mL.

The metal oxide nanoparticle ink 100 according to an embodiment of the present disclosure includes the metal oxide nanoparticle 111 from which the organic ligand 112 acting as an insulator is removed and the dispersion solvent 131 that does not decompose a halide included in a perovskite compound.

The metal oxide nanoparticle ink 100 may be used to form a charge transport layer in a photoelectric device including a perovskite compound.

Hereinafter, a metal oxide nanoparticle thin film manufactured using the metal oxide nanoparticle ink according to an embodiment of the present disclosure will be described.

The metal oxide nanoparticle thin film according to an embodiment of the present disclosure includes the components of the metal oxide nanoparticle ink, and thus repeated description thereof will be omitted.

The metal oxide nanoparticle thin film according to an embodiment of the present disclosure includes the metal oxide nanoparticle from which the organic ligand is removed, and may be formed on the photoactive layer of a photoelectric device.

In the description of the present disclosure, the photoelectric device may be a solar cell, a tandem solar cell, or a light-emitting device.

In the description of the present disclosure, the photoactive layer refers to a configuration that is included in a photoelectric device and generates power using light energy obtained by absorbing external light.

According to an embodiment of the present disclosure, the light-emitting device may be an LED, an OLED, or a light sensor, but any device including a photoactive layer as a component may be used as the light-emitting device without limitation.

The metal oxide nanoparticle thin film according to an embodiment of the present disclosure may be formed by uniformly applying the metal oxide nanoparticle ink to the photoactive layer of the photoelectric device through a solution process.

According to an embodiment of the present disclosure, to form the metal oxide nanoparticle thin film, the metal oxide nanoparticle ink may be applied on the photoactive layer using any one method of spin coating, spray coating, ultra-spray coating, electrospinning coating, slot die coating, gravure coating, bar coating, roll coating, dip coating, shear coating, screen printing, inkjet printing, and nozzle printing.

The metal oxide nanoparticle thin film according to an embodiment of the present disclosure may have a thickness of 10 nm to 1,000 nm depending on the concentration of the metal oxide nanoparticle ink and the number of times the photoactive layer is coated with the metal oxide nanoparticle ink.

Preferably, when the metal oxide nanoparticle thin film according to an embodiment of the present disclosure is formed on the photoactive layer of the photoelectric device, the metal oxide nanoparticle thin film is formed to have a thickness of 20 nm to 150 nm taking into account the resistance of the metal oxide nanoparticle thin film.

Since the metal oxide nanoparticle thin film according to an embodiment of the present disclosure is manufactured using the metal oxide nanoparticle ink having high dispersibility for the metal oxide nanoparticle, the metal oxide nanoparticle thin film may be uniformly formed on the photoactive layer of the photoelectric device, and may be formed in the form of a dense thin film having a nanometer-scale thickness.

Hereinafter, a photoelectric device including the metal oxide nanoparticle thin film according to an embodiment of the present disclosure will be described with reference to FIGS. 3A and 3B.

The photoelectric device according to an embodiment of the present disclosure includes all of the components of FIGS. 1 and 2, and thus repeated description thereof will be omitted.

Figure 3A:
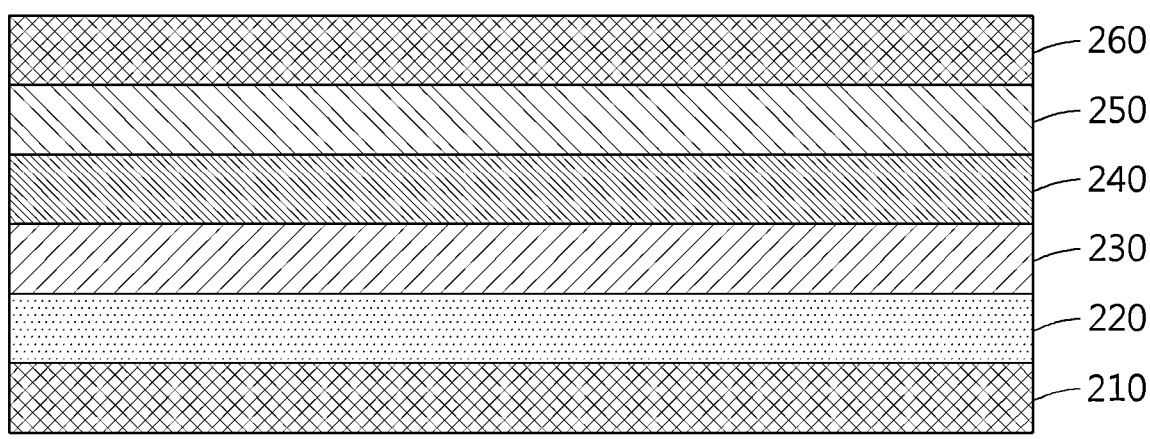
FIGS. 3A and 3B each illustrate a cross-sectional view of a photoelectric device including a metal oxide nanoparticle thin film according to an embodiment of the present disclosure.
Figure 3B:
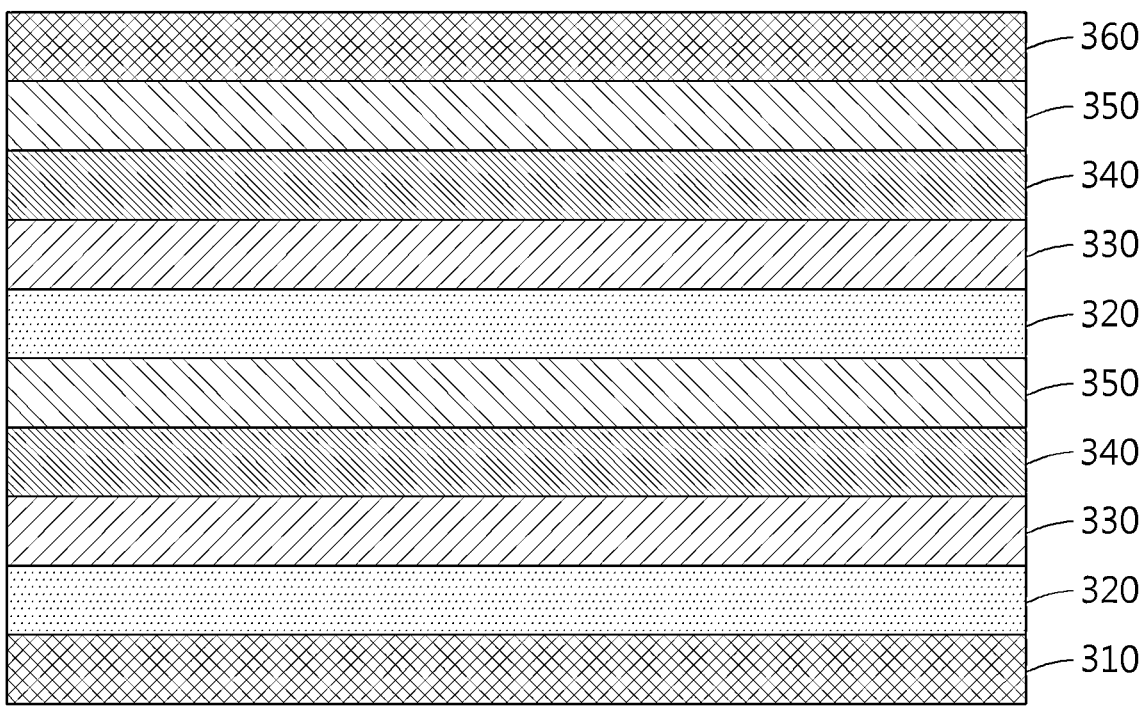

FIGS. 3A and 3B each illustrate a cross-sectional view of a photoelectric device including a metal oxide nanoparticle thin film according to an embodiment of the present disclosure.

Referring to FIG. 3A, a photoelectric device 200 according to an embodiment of the present disclosure includes a first electrode 220 formed on a substrate 210, a first semiconductor layer 230 formed on the first electrode 220, a perovskite photoactive layer 240 formed on the first semiconductor layer 230 and including a perovskite compound, a second semiconductor layer 250 formed as a metal oxide nanoparticle thin film on the perovskite photoactive layer 240, and a second electrode 260 formed on the second semiconductor layer 250.

The substrate 210 may be an organic material substrate or an inorganic material substrate.

The inorganic material substrate may be formed of glass, quartz, $Al_2O_3$, SiC, Si, GaAs, or InP, without being limited thereto.

The organic material substrate may be selected from Kapton foil, polyimide (PI), polyethersulfone (PES), polyacrylate (PAR), polyetherimide (PEI), polyethylene naphthalate (PEN), polyethylene terephthalate (PET), polyphenylene sulfide (PPS), polyarylate, polycarbonate (PC), cellulose triacetate (CTA), and cellulose acetate propionate (CAP), without being limited thereto.

The inorganic material substrate and the organic material substrate are preferably formed of a transparent material through which light transmits. In general, a substrate that may be positioned on a front electrode may be used as the substrate 210. When the organic material substrate is used, the flexibility of an electrode may be increased.

The first electrode 220 is formed on the substrate 210. Preferably, to increase light transmittance, a conductive electrode, in particular, a transparent conductive electrode, is used as the first electrode 220.

For example, the first electrode 220 may be a front electrode, which is an electrode provided on a side at which light is received.

According to an embodiment of the present disclosure, the first electrode 220 may be an anode or a cathode.

When the first electrode 220 is an anode, the first electrode 220 may include a material selected from the group consisting of fluorine-doped tin oxide (FTO), indium-doped tin oxide (ITO), aluminum-doped zinc oxide (AZO), indium-doped zinc oxide (IZO), and mixtures thereof, without being limited thereto.

When the first electrode 220 is a cathode, the first electrode 220 may include lithium fluoride/aluminum (LiF/Al), gold (Au), silver (Ag), platinum (Pt), palladium (Pd), copper (Cu), aluminum (Al), carbon (C), cobalt sulfide (CoS), copper sulfide (CuS), nickel oxide (NiO), or a mixture thereof, without being limited thereto.

Preferably, when the first electrode 220 is an anode, the first electrode 220 may include ITO, which is a transparent electrode having a large work function to facilitate injection of holes to the highest occupied molecular orbital (HOMO) level of the perovskite photoactive layer 240.

The first electrode 220 may be formed on the substrate 210 using any one of thermal evaporation, e-beam evaporation, radio frequency (RF) sputtering, magnetron sputtering, vacuum deposition, and chemical vapor deposition.

According to an embodiment of the present disclosure, the first electrode 220 may be a transparent conductive electrode having an OMO (O: organic material or metal oxide, M: metal) structure.

According to an embodiment of the present disclosure, the first semiconductor layer 230 formed on the first electrode 220 is formed of an n-type semiconductor material, and thus may serve as an electron transport layer.

That is, when the first electrode 220 is a cathode and the second electrode 260 is an anode, and when the photoelectric device 200 according to an embodiment of the present disclosure is used as a light-emitting device, electrons injected from the first electrode 220 may be transferred to the perovskite photoactive layer 240.

Alternatively, when the first electrode 220 is a cathode and the second electrode 260 is an anode, and when the photoelectric device 200 according to an embodiment of the present disclosure is used as a solar cell, electrons generated in the perovskite photoactive layer 240 may be easily transferred to the first electrode 220.

When the first semiconductor layer 230 is formed of an n-type semiconductor material, the first semiconductor layer 230 may include at least one of fullerene (C60), fullerene derivatives, perylene, 2,2',2''-(1,3,5-benzinetriyl)-tris(1-phenyl-1-H-benzimidazole) (TPBi), polybenzimidazole (PBI) and 3,4,9,10-perylene-tetracarboxylic bis-benzimidazole (PTCBI), naphthalene diimide (NDI) and derivatives thereof, $TiO_2$, $SnO_2$, ZnO, $ZnSnO_3$, 2,4,6-tris(3-(pyrimidin-5-yl)phenyl)-1,3,5-triazine, 8-hydroxyquinolinato-lithium, 1,3,5-tris(1-phenyl-1Hbenzimidazol-2-yl)benzene, 6,6'-bis[5-(biphenyl-4-yl)-1,3,4-oxadiazo-2-yl]-2,2'-bipyridyl, 4,4'-bis(4,6-diphenyl-1,3,5-triazin-2-yl)biphenyl (BTB), rubidium carbonate ($Rb_2CO_3$), and rhenium(VI) oxide ($ReO_3$). The fullerene derivative may be (6,6)-phenyl-C61-butyric acid-methylester (PCBM) or (6,6)-phenyl-C61-butyric acid cholesteryl ester (PCBCR), without being limited thereto.

According to an embodiment of the present disclosure, when the first electrode 220 is an anode and the second electrode 260 is a cathode, the first semiconductor layer 230 may serve as a hole transport layer formed of a p-type semiconductor material.

For example, when the first electrode 220 is an anode and the second electrode 260 is a cathode, and when the photoelectric device 200 according to an embodiment of the present disclosure is used as a light-emitting device, holes injected from the first electrode 220 may be transferred to the perovskite photoactive layer 240.

Alternatively, when the first electrode 220 is an anode and the second electrode 260 is a cathode, and when the photoelectric device 200 according to an embodiment of the present disclosure is used as a solar cell, holes generated in the perovskite photoactive layer 240 may be easily transferred to the first electrode 220.

When the first semiconductor layer 230 is formed of a p-type semiconductor material, the first semiconductor layer 230 may include at least one of poly(3-hexylthiophene) (P3HT), poly[2-methoxy-5-(3',7'-dimethyloctyloxyl)-1,4-phenylene vinylene] (MDMO-PPV), poly[2-methoxy-5-(2''-ethylhexyloxy)-p-phenylene vinylene] (MEH-PPV), poly(3-octyl thiophene) (P3OT), poly(octyl thiophene) (POT), poly (3-decyl thiophene) (P3DT), poly(3-dodecyl thiophene (P3DDT), poly(p-phenylene vinylene) (PPV), poly(9,9'-dioctylfluorene-co-N-(4-butylphenyl)diphenyl amine (TFB), polyaniline, [2,22',7,77'-tetrkis(N,N-dimethoxyphenylamine)-9,9,9'-spirobi fluorine] (Spiro-MeOTAD), CuSCN, CuI, MoOx, VOx, NiOx, CuOx, poly[2,1,3-benzothiadiazole-4,7-diyl[4,4-bis(2-ethylhexyl-4H-cyclopenta[2,1-b:3,4-b']dithiophene-2,6-diyl]] (PCPDTBT), poly[(4,4'-bis(2-ethylhexyl)dithieno[3,2-b:2',3'-d]silole)-2,6-diyl-alt-(2,1,3-benzothiadiazole)-4,7-diyl] (Si-PCPDTBT), poly((4,8-diethylhexyloxyl)benzo([1,2-b:4,5-b']dithiophene)-2,6-diyl)-alt-((5-octylthieno[3,4-c]pyrrole-4,6-dione)-1,3-diyl) (PBDTTPD), poly[2,7-(9-(2-ethylhexyl)-9-hexyl-fluorene)-alt-5,5-(4',7,-di-2-thienyl-2',1',3'-benzothiadiazole)] (PFDTBT), poly[2,7-9,9-(dioctyl-fluorene)-alt-5,5-(4',7'-di-2-thienyl-2',1'-benzothiadiazole)] (PFO-DBT), poly[(2,7-dioctylsilafluorene)-2,7-diyl-alt-(4,7-bis(2-thienyl)-2,1,3-benzothiadiazole)-5,5'-diyl] (PSiFDTBT), poly[(4,4'-bis(2-ethylhexyl)dithieno[3,2-b:2',3'-d]silole)-2,6-diyl-alt-(2,1,3-benzothiadiazole)-4,7-diyl] (PSBTBT), poly[[9-(1-octylnonyl)-9H-carbazole-2,7-diyl]-2,5-thiophenediyl-2,1 benzothiadiazole-4,7-diyl-2,5-thiophenediyl] (PCDTBT), poly(9,9'-dioctylfluorene-co-bis(N,N'-(4-butylphenyl))bis (N,N'-phenyl-1,4-phenylene)diamine (PFB), poly(9,9'-dioctylfluorene-cobenzothiadiazole (F8BT), poly(3,4-ethylene-dioxythiophene) (PEDOT), poly(3,4-ethylenedioxythiophene) polystyrene sulfonate (PEDOT: PSS), poly(triarylamine) (PTAA), poly(4-butylphenyldiphenyl-amine), 4,4'-bis[N-(1-naphtyl)-N-phenylamino]-biphenyl (NPD), (PEDOT:PSS) bis(N-(1-napthyl-n-phenyl))benzidine(α-NPD) mixed with a perfluorinated ionomer (PFI), N,N'-di(naphthalene-1-yl)-N, N'-diphenyl-benzidine (NPB), N,N'-diphenyl-N,N'-bis(3-methylphenyl)-1,1'-diphenyl-4,4'-diamine (TPD), copper phthalocyanine (CuPc), 4,4',4''-tris(3-methylphenylamino) triphenylamine (m-MTDATA), 4,4',4''-tris(3-methylphenylamino)phenoxybenzene (m-MTDAPB), 4,4',4''-tri(N-carbazolyl)triphenylamine (TCTA) as a starburst-type amine, 4,4',4''-tris(N-(2-napthyl)-N-phenylamine)-triphenylamine (2-TNATA), and copolymers thereof, without being limited thereto.

The perovskite photoactive layer 240 may be formed on the first semiconductor layer 230, and may include a perovskite compound represented by Chemical Formula below.

$$AMX_3 \qquad \text{[Chemical Formula]}$$

In Chemical Formula, A represents a monovalent cation, M represents a divalent metal cation, and X represents a halogen anion.

Depending on the type of the monovalent cation A of Chemical Formula, the perovskite compound may be an organic/inorganic hybrid perovskite compound or an inorganic metal halide perovskite compound.

More specifically, in Chemical Formula, when the monovalent cation A is a monovalent organic cation, the perovskite compound may be composed of A, which is an organic material, and M and X, which are inorganic materials, and thus may be an organic/inorganic hybrid perovskite compound in which the organic material and the inorganic materials are mixed.

On the other hand, in Chemical Formula, when A is a monovalent inorganic cation, the perovskite compound may be composed of A, M, and X, which are inorganic materials, and thus may be an inorganic metal halide perovskite compound, wherein all components are inorganic materials.

When the monovalent cation A is an organic cation, the monovalent cation A may be a C1 to 24 straight or branched alkyl group, an amine group ($-NH_3$), a hydroxyl group ($-OH$), a cyano group ($-CN$), a halogen group, a nitro group ($-NO$), a methoxy group ($-OCH_3$), a C1 to 24 straight or branched alkyl group substituted with an imidazolium group, or a combination thereof.

According to an embodiment of the present disclosure, the monovalent cation may be any one of $H_3NH_3^+$, $HC(NH_2)_2^+$, and $Cs^+$.

When the monovalent cation A is an inorganic cation, the monovalent cation A may be $Li^+$, $Na^+$, $K^+$, $Rb^+$, $Cs^+$, $Fr^+$, $Cu(I)^+$, $Ag(I)^+$, $Au(I)^+$, or a combination thereof.

The divalent metal cation M may include at least one of $Pb^{2+}$, $Sn^{2+}$, $Ge^{2+}$, $Cu^{2+}$, $Co^{2+}$, $Ni^{2+}$, $Ti^{2+}$, $Zr^{2+}$, $Hf^{2+}$, $Rf^{2+}$, $In^{3+}$, $Bi^{3+}$, $Co^{3+}$, $Sb^{3+}$, and $Ni^{3+}$.

X, which is a monovalent anion, may be a halogen anion including $F^-$, $Cl^-$, $Br$, or $I$.

According to an embodiment of the present disclosure, the perovskite compound may have a single structure, a double structure, a triple structure, or a Ruddlesden-Popper structure.

The single structure perovskite compound means that the perovskite compound of Chemical Formula has a three-dimensional single phase, and the double structure perovskite compound refers to the perovskite photoactive layer 240 formed by alternately laminating $(A1)_a(M1)_b(X1)_c$ and $(A2)_a(M2)_b(X2)_c$.

In this case, in Chemical Formula $(A1)_a(M1)_b(X1)_c$ and Chemical Formula $(A2)_a(M2)_b(X2)_c$, A1 and A2 are identical or different monovalent cations, M1 and M2 are identical or different divalent metal cations or trivalent metal cations, and X1 and X2 are identical or different monovalent anions. In this case, between [A1, M1, and X1] and [A2, M2, and X2], there is at least one difference.

The triple structure perovskite compound is the perovskite photoactive layer 240 formed by alternately laminating $(A1)_a(M1)_b(X1)_c$, $(A2)_a(M2)_b(X2)_c$, and $(A3)_a(M3)_b(X3)_c$. In this case, A1, A2, and A3 are identical or different monovalent cations, M1, M2, and M3 are identical or different divalent metal cations or trivalent metal cations, and X1, X2, and X3 are identical or different monovalent anions. In this case, between [A1, M1, and X1], [A2, M2, and X2], and [A3, M3, and X3], there is at least one difference.

The Ruddlesden-Popper structure is a structure of $(A1)_a(M1)_b(X1)_c\{(A2)_a(M2)_b(X2)_c\}_n(A1)_a(M1)_b(X1)_c$. In this case, n is a natural number.

The second semiconductor layer 250 formed on the perovskite photoactive layer 240 may be formed of the metal oxide nanoparticle thin film according to an embodiment of the present disclosure.

Specifically, the second semiconductor layer 250 may be formed of a metal oxide nanoparticle thin film formed by applying the metal oxide nanoparticle ink on the upper surface of the perovskite photoactive layer 240, and thus may include a metal oxide nanoparticle from which an organic ligand is removed.

According to an embodiment of the present disclosure, the metal oxide nanoparticle included in the second semiconductor layer 250 may be an n-type semiconductor material or a p-type semiconductor material.

Specifically, when the first semiconductor layer 230 is formed of an n-type semiconductor material, the second semiconductor layer 250 may be formed of a p-type semiconductor material.

For example, when the first semiconductor layer 230 is formed of an n-type semiconductor material, the second semiconductor layer 250 may include a p-type semiconductor material such as a metal oxide nanoparticle including nickel oxide.

Alternatively, when the first semiconductor layer 230 is formed of a p-type semiconductor material, the second semiconductor layer 250 may be formed of an n-type semiconductor material.

For example, when the first semiconductor layer 230 is formed of a p-type semiconductor material, the second semiconductor layer 250 may include an n-type semiconductor material such as a metal oxide nanoparticle including tin oxide.

When the second semiconductor layer 250 includes a p-type semiconductor material, the second semiconductor layer 250 may serve as a hole transport layer, and when the second semiconductor layer 250 includes an n-type semiconductor material, the second semiconductor layer 250 may serve as an electron transport layer.

The metal oxide nanoparticle ink, the metal oxide nanoparticle, and the metal oxide nanoparticle thin film according to an embodiment of the present disclosure have been described with reference to FIGS. 1 and 2, and thus repeated description thereof will be omitted.

The second semiconductor layer 250 may be formed by applying the metal oxide nanoparticle ink to the perovskite photoactive layer 240 using any one of spin coating, spray coating, ultra-spray coating, electrospinning coating, slot die coating, gravure coating, bar coating, roll coating, dip coating, shear coating, screen printing, inkjet printing, and nozzle printing.

After the metal oxide nanoparticle ink is applied to the upper surface of the perovskite photoactive layer 240, the second semiconductor layer 250 may be subjected to a drying process.

Accordingly, the second semiconductor layer 250 may include a metal oxide nanoparticle.

According to an embodiment of the present disclosure, the second electrode 260 may be formed on the second semiconductor layer 250, and may be an anode or cathode.

Specifically, when the first electrode 220 is an anode, the second electrode 260 may be a cathode. When the first electrode 220 is a cathode, the second electrode 260 may be an anode.

Description of materials constituting the second electrode 260 is the same as that of the materials constituting the first electrode 220, and repeated description thereof will be omitted.

In addition, a method of forming the second electrode 260 is the same as that of the first electrode 220, and thus repeated description thereof will be omitted.

The photoelectric device 200 according to an embodiment of the present disclosure includes the second semiconductor layer 250 including a metal oxide nanoparticle from which an organic ligand acting as an insulator is removed. Thus, the second semiconductor layer 250 may be formed without decomposing a halide contained in the perovskite photoactive layer 240.

That is, in the photoelectric device 200 according to an embodiment of the present disclosure, when the second semiconductor layer 250 is formed on the upper surface of the perovskite photoactive layer 240, unlike a conventional technology of using an organic material, the second semiconductor layer 250 may be formed in a uniform and dense thin film having a nanometer-scale thickness by using metal oxide nanoparticle ink including a metal oxide nanoparticle and a dispersion solvent without damage to the upper surface of the perovskite photoactive layer 240.

In addition, when the photoelectric device 200 according to an embodiment of the present disclosure is a solar cell, by including the second semiconductor layer 250 formed of the metal oxide nanoparticle ink, photoelectric conversion rate may be improved. In addition, even when the photoelectric device 200 is exposed to a humid and high temperature environment for a long time, the photoelectric device 200 may be stably driven as a solar cell for a long time.

In addition, unlike the case of using a hole transport layer formed of a conventional organic material, the photoelectric device 200 according to an embodiment of the present disclosure may have excellent long-term stability, and may be mass manufactured at low cost, thereby improving commercialization.

In addition to a single junction solar cell, the photoelectric device 200 according to an embodiment of the present disclosure may be applied to a tandem solar cell or a light-emitting device.

When the photoelectric device 200 according to an embodiment of the present disclosure is a tandem solar cell, the photoelectric device 200 may have a structure, wherein the first semiconductor layer 230, the perovskite photoactive layer 240, and the second semiconductor layer 250 are repeatedly laminated.

Referring to FIG. 3B, when a photoelectric device 300 according to an embodiment of the present disclosure is a tandem solar cell, the photoelectric device 300 may include a substrate 310, first electrodes 320, first semiconductor layers 330, perovskite photoactive layers 340, second semiconductor layers 350, first semiconductor layers 330, perovskite photoactive layers 340, second semiconductor layers 350, and a second electrode 360.

In this case, as described in FIG. 3A, the first semiconductor layers 330 may be formed of an n-type semiconductor material or a p-type semiconductor material.

According to an embodiment of the present disclosure, two first semiconductor layers 330 may be formed of different n-type semiconductor materials, or two first semiconductor layers 330 may be formed of different p-type semiconductor materials.

For example, two first semiconductor layers 330 may include $TiO_2$ of an n-type semiconductor material and ZnO of an n-type semiconductor material, respectively.

According to an embodiment of the present disclosure, two perovskite photoactive layers 340 may include different perovskite compounds including different materials represented by Chemical Formula, respectively.

In addition, the photoelectric device according to an embodiment of the present disclosure may be a light-emitting device. According to an embodiment of the present disclosure, the light-emitting device may be, for example, an LED, an OLED, or a light sensor.

Hereinafter, the properties of the metal oxide nanoparticle ink according to an embodiment of the present disclosure and the photoelectric device using the same were evaluated according to examples, and the properties and effects of the metal oxide nanoparticle ink and the photoelectric device were confirmed.

Preparation of Metal Oxide Nanoparticle

Example 1

A solution prepared by mixing 10 mL of an oleylamine-containing ligand solution and a 1 mmol nickel (Ni) acetylacetonate as a metal oxide precursor was put in a Teflon bottle placed in a steel autoclave, and was held at 180° C. for 6 hours.

After reaction, the steel autoclave was cooled to room temperature, and the generated NiO-oleate nanoparticle, which was a metal oxide nanoparticle, was washed with acetone and ethanol.

Then, the washed NiO-oleate nanoparticle was dispersed in 5 ml of hexane as a solvent to prepare a dispersion solution containing the NiO-oleate nanoparticle.

0.1 g of sodium acetate was added to the dispersion solution to adjust the pH of the dispersion solution to 6, and then ultrasonication was performed using a sonicator for 30 minutes to vigorously mix the dispersion solution.

Then, an NiO nanoparticle from which the organic ligand had been removed was obtained by centrifugation.

The obtained NiO nanoparticle was washed with acetone one more time, and was subjected to freezing and drying.

Preparation of Metal Oxide Nanoparticle Ink

Example 2

The NiO nanoparticle of Example 1 was dispersed at a concentration of 20 mg/mL in a dispersion solvent prepared by mixing 1-butanol and chloroform in a volume ratio of 1:1 to prepare NiO nanoparticle ink.

Example 2-1

NiO nanoparticle ink was prepared in the same manner as in Example 2, except that a dispersion solvent prepared by mixing 1-butanol and chloroform in a volume ratio of 4:1 was used.

Example 2-2

NiO nanoparticle ink was prepared in the same manner as in Example 2, except that a dispersion solvent prepared by mixing 1-butanol and chloroform in a volume ratio of 3:2 was used.

Example 2-3

NiO nanoparticle ink was prepared in the same manner as in Example 2, except that a dispersion solvent prepared by mixing 1-butanol and chloroform in a volume ratio of 1:1 was used.

Example 2-4

NiO nanoparticle ink was prepared in the same manner as in Example 2, except that a dispersion solvent prepared by mixing 1-butanol and chloroform in a volume ratio of 2:3 was used.

Example 2-5

NiO nanoparticle ink was prepared in the same manner as in Example 2, except that a dispersion solvent prepared by mixing 1-butanol and chloroform in a volume ratio of 1:4 was used.

Example 2-6

The NiO nanoparticle of Example 1 was dispersed at a concentration of 20 mg/ml in a hexanol dispersion solvent to prepare NiO nanoparticle ink.

Comparative Example 1

The NiO-oleate nanoparticle prepared in Example 1 was dispersed in hexane to prepare NiO-oleate nanoparticle ink.

Comparative Example 2

According to a known aqueous synthesis method, an $Ni(OH)_2$ nanoparticle was prepared, and heat treatment was performed to prepare an NiO nanoparticle.

Then, the NiO nanoparticle was dispersed in hexane to prepare NiO nanoparticle ink.

Comparative Example 3

The NiO nanoparticle of Example 1 was dispersed at a concentration of 20 mg/mL in hexane to prepare NiO nanoparticle ink.

Comparative Example 4

The NiO nanoparticle of Example 1 was dispersed at a concentration of 20 mg/mL in chloroform to prepare NiO nanoparticle ink.

Comparative Example 5

The NiO nanoparticle of Example 1 was dispersed at a concentration of 20 mg/mL in 1-butanol to prepare NiO nanoparticle ink.

Manufacture of Solar Cell

Example 3

Using a solvent prepared by mixing dimethylsulfoxide and dimethylformamide in a ratio of 1:8, a $[CH_3NH_3PbBr_3]_{0.05}[HC(NH_2)_2PbI_3]_{0.95}$ solution, wherein the molar ratio of $CH_3NH_3Br_2$ to $PbBr_2$ was 1:1, the molar ratio of $HC(NH_2)_2I$ to $PbI_2$ was 1:1, and the molar ratio of $CH_3NH_3Br_2$ to $HC(NH_2)_2I$ was 1:4, was prepared at a concentration of 1 M.

A 1×1-inch glass substrate coated with fluorine-containing tin oxide (FTO; F-doped $SnO_2$, 8 ohms/cm$^2$, Pilkington, hereinafter referred to as FTO substrate) was washed sequentially with distilled water containing a surfactant, and with ethanol.

The washed FTO substrate was coated with a dispersion solution (Alfa Aesar), in which $SnO_2$ nanoparticles were diluted in distilled water in a ratio of 1:7, at 2,000 rpm by spin coating, and was heat-treated at 150° C. for 10 minutes to form an n-type layer.

The prepared solution was applied batchwise to the rotation center of the upper surface of the substrate on which the n-type layer had been formed, and then spin coating was performed at 5,000 rpm.

At 25 seconds after the start of spin coating, diethyl ether, which was a non-solvent, was applied batchwise to the rotation center of the rotating FTO substrate, and then spin coating was further performed for 5 seconds.

After spin coating, the FTO substrate was placed on a hot plate under conditions of 150° C. and atmospheric pressure for 10 minutes to form a first perovskite layer formed of a halide having a three-dimensional structure of $[CH_3NH_3PbBr_3]_{0.2}[HC(NH_2)_2PbI_3]_{0.5}$.

Then, the upper surface of the perovskite photoactive layer was coated with the NiO nanoparticle ink of Example 2-3 at 2,000 rpm for 30 seconds by spin coating, and then was dried at 120° C. for 10 minutes to form a second semiconductor layer (hole transport layer) having a thickness of 40 nm.

Then, gold was deposited in a thickness of 30 nm on the second semiconductor layer to form a second electrode. Thereby, manufacture of a solar cell was completed.

Comparative Example 6

A solar cell was manufactured in the same manner as in Example 3, except that a second semiconductor layer as a hole transport layer was formed using the NiO-oleate nanoparticle ink of Comparative Example 1.

Comparative Example 7

A solar cell was manufactured in the same manner as in Example 3, except that a second semiconductor layer as a hole transport layer was formed using the NiO nanoparticle ink of Comparative Example 2.

Comparative Example 8

A solar cell was manufactured in the same manner as in Example 3, except that a second semiconductor layer was not formed.

Comparative Example 9

A solar cell was manufactured in the same manner as in Example 3, except that, instead of NiO, a Spiro-MeOTAD solution (solvent: chlorobenzene) having a concentration of 90 g/L was applied batchwise, and spin coating was performed at 2,000 rpm for 30 seconds to form a second semiconductor layer as a hole transport layer on the upper surface of a perovskite layer.

Evaluation of Properties

Figure 4A:
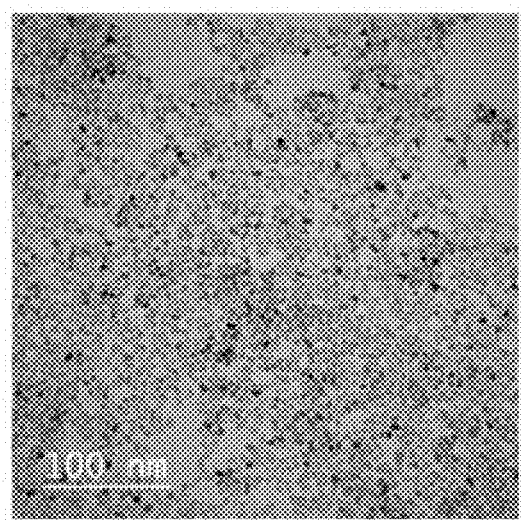
FIGS. 4A and 4B show an image of a metal oxide nanoparticle according to an embodiment of the present disclosure taken using a transmission electron microscope (TEM) and a fast Fourier transport (FFT) pattern, respectively.
Figure 4B:
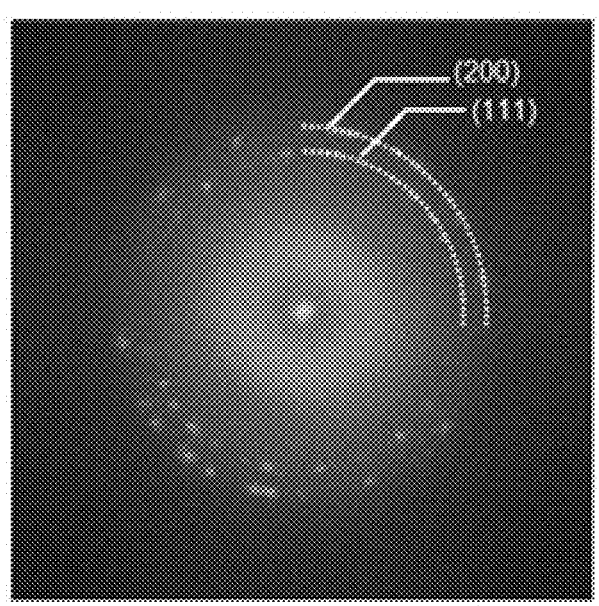

FIGS. 4A and 4B show an image of a metal oxide nanoparticle according to an embodiment of the present disclosure taken using a transmission electron microscope (TEM) and a fast Fourier transport (FFT) pattern, respectively.

Referring to FIGS. 4A and 4B, it can be confirmed that the NiO nanoparticle of Example 1 has a diameter of 3 nm or less, and the spacing between the NiO nanoparticles from which organic ligands are removed is reduced.

In addition, FIG. 4B shows that the NiO nanoparticle of Example 1 exhibiting a clear NiO crystal FFT pattern has crystallinity.

Figure 5:
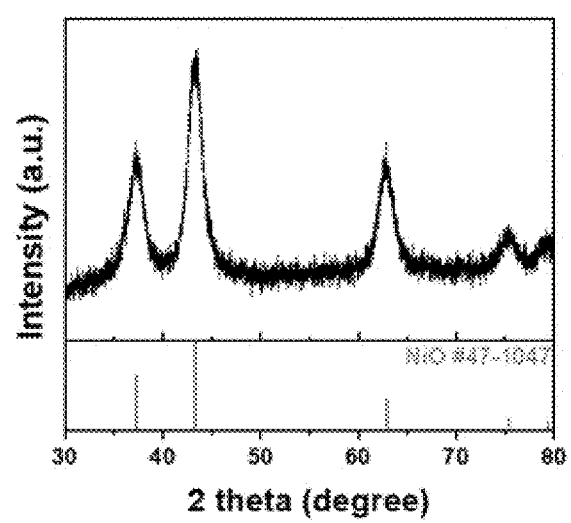
FIG. 5 is a graph showing the X-ray diffraction (XRD) pattern of a metal oxide nanoparticle included in a second semiconductor layer according to an embodiment of the present disclosure.

FIG. 5 is a graph showing the X-ray diffraction (XRD) pattern of a metal oxide nanoparticle included in a second semiconductor layer according to an embodiment of the present disclosure.

Referring to FIG. 5, the XRD pattern of the NiO nanoparticle of Example 1 coincides with the representative XRD pattern of NiO, indicating that the NiO nanoparticle of Example 1 is NiO without other secondary phases.

Figure 6:
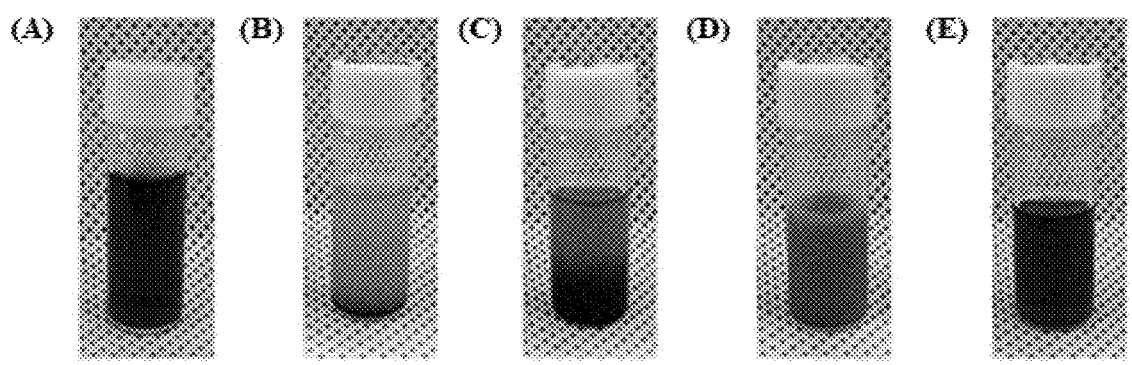
FIG. 6 includes images of metal oxide nanoparticle ink according to examples and comparative examples of the present disclosure.

FIG. 6 includes images of metal oxide nanoparticle ink according to examples and comparative examples of the present disclosure.

Referring to FIG. 6A, it can be confirmed that the NiO-oleate nanoparticle ink of Comparative Example 1 has high dispersibility in hexane, which is a nonpolar solvent, due to an organic ligand surrounding the NiO-oleate nanoparticle.

Referring to FIG. 6B, it can be confirmed that, since the NiO nanoparticle ink of Comparative Example 3 has low dispersibility in hexane, which is a nonpolar solvent, the NiO nanoparticle precipitates.

Referring to FIG. 6C, it can be confirmed that, since the NiO nanoparticle ink of Comparative Example 4 has low dispersibility in chloroform, which is a nonpolar solvent, the NiO nanoparticle precipitates.

Referring to FIG. 6D, it can be confirmed that, since the NiO nanoparticle ink of Comparative Example 5 has low dispersibility in 1-butanol, which is a polar solvent, the NiO nanoparticle precipitates.

Referring to FIG. 6E, it can be confirmed that the NiO nanoparticle ink of Example 2 has high dispersibility in a dispersion solvent prepared by mixing a polar solvent and a nonpolar solvent, i.e., by mixing 1-butanol and chloroform.

Accordingly, it can be confirmed that the NiO nanoparticle according to an embodiment of the present disclosure has a higher dispersibility in a solvent prepared by mixing a polar solvent and a nonpolar solvent than in a polar solvent or a nonpolar solvent.

Figure 7:
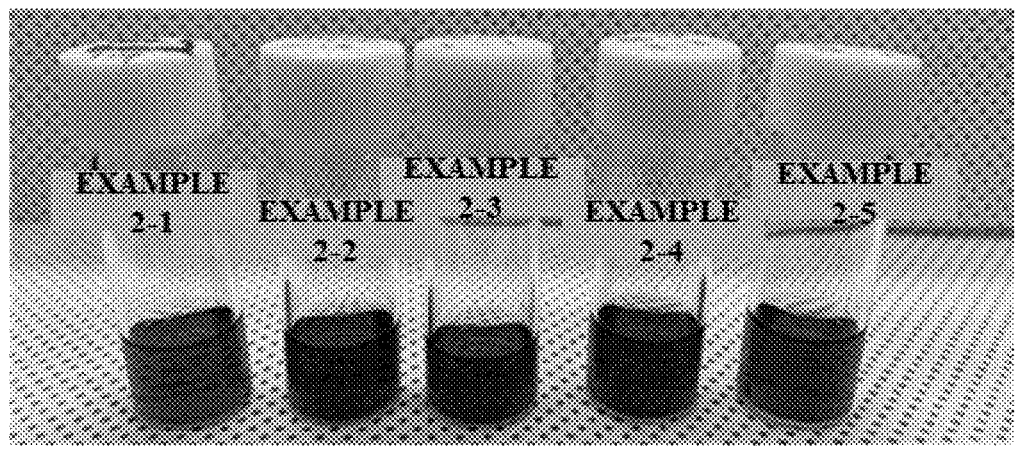
FIG. 7 includes images showing the states of metal oxide nanoparticle ink according to an embodiment of the present disclosure depending on the mixing volume ratio of a dispersion solvent.

FIG. 7 includes images showing the states of metal oxide nanoparticle ink according to an embodiment of the present disclosure depending on the mixing volume ratio of a dispersion solvent.

Referring to FIG. 7, it can be confirmed that the NiO nanoparticles of Examples 2-1 to 2-5 exhibit slight difference in the degree of dispersion depending on the mixing volume ratio of 1-butanol and chloroform included in the dispersion solvent, but exhibit high dispersibility in the dispersion solvent.

Figure 8:
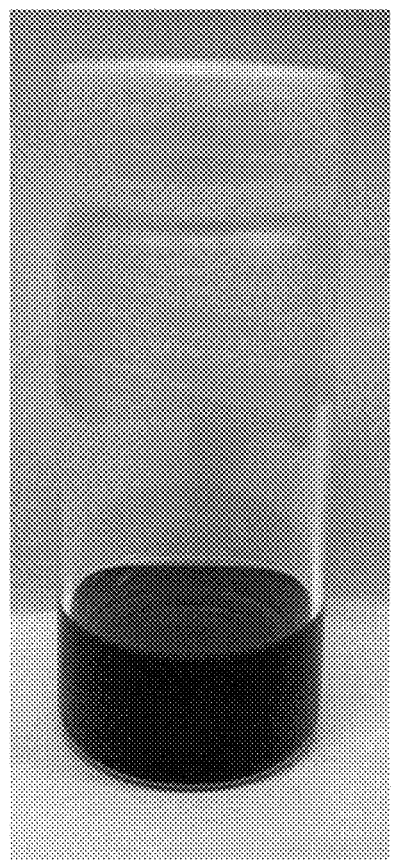
FIG. 8 is an image showing the state of metal oxide nanoparticle ink according to an embodiment of the present disclosure depending on a dispersion solvent.

FIG. 8 is an image showing the state of metal oxide nanoparticle ink according to an embodiment of the present disclosure depending on a dispersion solvent.

Referring to FIG. 8, it can be confirmed that the NiO nanoparticle of Example 2-6 has high dispersibility in the dispersion solvent.

Figure 9:
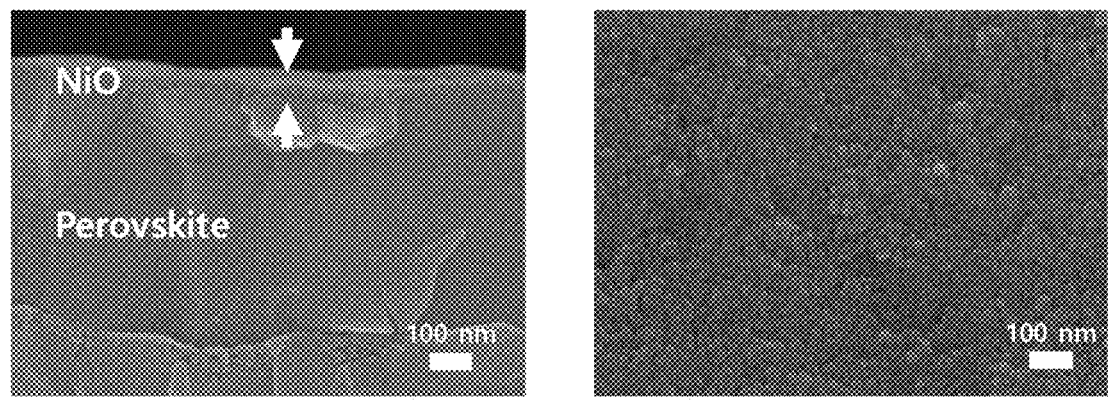
FIG. 9 includes images, taken using a scanning electron microscope (SEM), showing the cross section and surface of a second semiconductor layer formed on the upper surface of a perovskite photoactive layer using metal oxide nanoparticle ink according to an embodiment of the present disclosure.

FIG. 9 includes images, taken using a scanning electron microscope (SEM), showing the cross section and surface of a second semiconductor layer formed on the upper surface of a perovskite photoactive layer using metal oxide nanoparticle ink according to an embodiment of the present disclosure.

FIG. 9 includes a section image and a surface image taken using a scanning electron microscope (SEM) after forming the second semiconductor layer containing NiO on the upper surface of the perovskite photoactive layer using the NiO nanoparticle ink prepared in Example 2-3 according to the process of manufacturing a solar cell of Example 3.

Referring to the section image of FIG. 9, it can be confirmed that an NiO layer having a thickness of 60 nm is formed on the upper surface of the perovskite photoactive layer.

In addition, referring to the surface image of FIG. 9, it can be confirmed that the second semiconductor layer containing NiO is formed densely and uniformly.

Accordingly, it can be confirmed that, using the NiO nanoparticle ink according to an embodiment of the present disclosure, a dense NiO thin film having a thickness of several tens of nanometers may be formed on the upper surface of the perovskite photoactive layer without damage to the perovskite photoactive layer.

Figure 10:
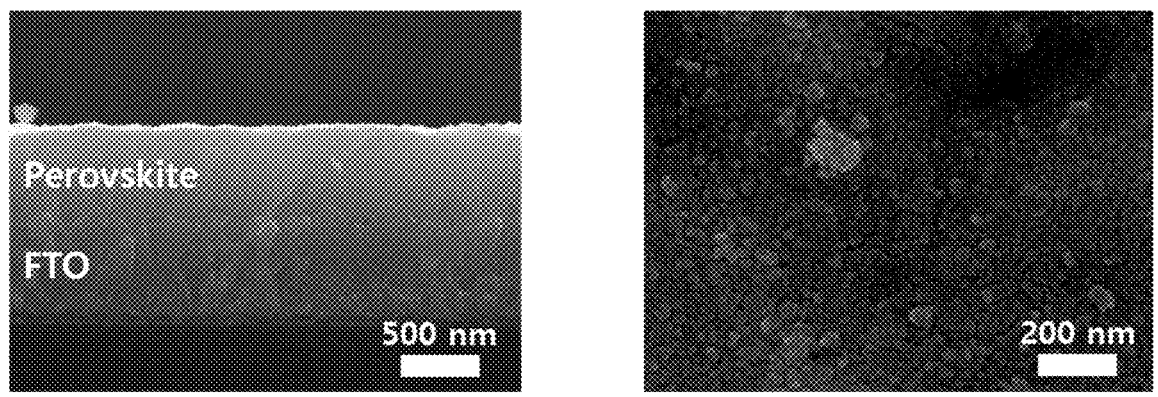
FIG. 10 includes images, taken using a scanning electron microscope (SEM), showing the cross section and surface of a second semiconductor layer formed on the upper surface of a perovskite photoactive layer using metal oxide nanoparticle ink according to a comparative example of the present disclosure.

FIG. 10 includes images, taken using a scanning electron microscope (SEM), showing the cross section and surface of a second semiconductor layer formed on the upper surface of a perovskite photoactive layer using metal oxide nanoparticle ink according to a comparative example of the present disclosure.

FIG. 10 includes a section image and a surface image taken using a scanning electron microscope (SEM) after forming the second semiconductor layer containing NiO on the upper surface of the perovskite photoactive layer using the NiO nanoparticle ink prepared in Comparative Example 2 according to the process of manufacturing a solar cell of Comparative Example 7.

Referring to FIG. 10, in the section image, formation of an NiO layer is not observed. In addition, in the surface image, a non-uniform NiO layer is observed.

These results indicate that, in the case of the conventional method of manufacturing metal oxide nanoparticle ink by synthesizing an NiO nanoparticle using $Ni(OH)_2$, preparation of metal oxide nanoparticle ink having high dispersibility is difficult due to coagulation of the metal oxide nanoparticle.

Figure 11:
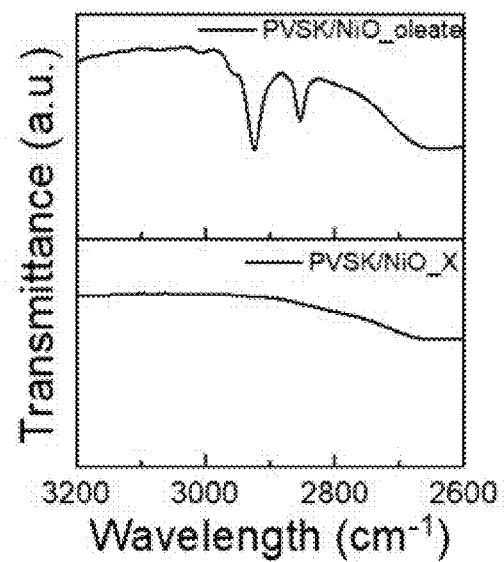
FIG. 11 is a graph that compares the results of Fourier transform infrared spectroscopy (FT-IR) analysis of a second semiconductor layer formed on a perovskite photoactive layer according to an example or a comparative example of the present disclosure.

FIG. 11 is a graph that compares the results of Fourier transform infrared spectroscopy (FT-IR) analysis of a second semiconductor layer formed on a perovskite photoactive layer according to an example or a comparative example of the present disclosure.

In FIG. 11, referring to the FT-IR analysis results of the second semiconductor layer (PVSK/NiO_oleate) of Comparative Example 6, peaks are observed due to the organic ligand of the NiO-oleate nanoparticle.

However, referring to the FT-IR analysis results of the second semiconductor layer (PVSK/NiO_X) of Example 3, since the organic ligand is removed from the NiO nanoparticle, peaks observed in Comparative Example 6 are not observed.

Figure 12:
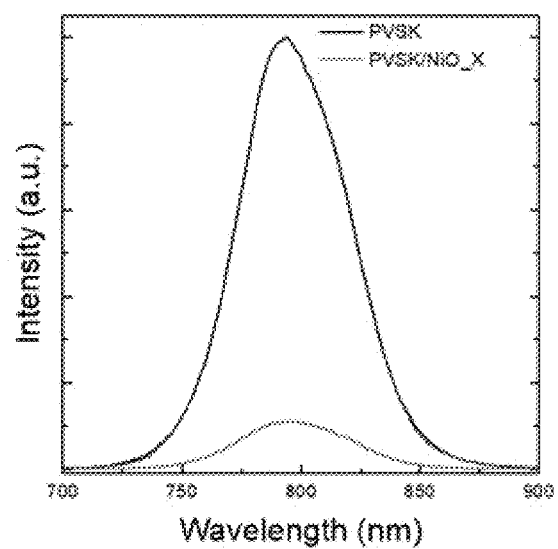
FIG. 12 is a graph showing the steady-state photoluminescence of a perovskite photoactive layer according to an example or a comparative example of the present disclosure.

FIG. 12 is a graph showing the steady-state photoluminescence of a perovskite photoactive layer according to an example or a comparative example of the present disclosure.

In FIG. 12, referring to the analysis results of steady-state photoluminescence for the second semiconductor layer formed on the solar cell of Example 3 or Comparative Example 8, the PL strength (PVSK/NiO_X) of Example 3 is significantly reduced as compared to the PL strength (PVSK) of Comparative Example 8.

These results are due to the NiO nanoparticle of Example 3, which is an p-type semiconductor material.

That is, when the second semiconductor layer is formed on the upper surface of the perovskite photoactive layer using the metal oxide nanoparticle ink of the present disclosure, charges generated in the perovskite photoactive layer may be efficiently injected into the second semiconductor layer.

The efficiency properties of the solar cells according to Example 3, Comparative Example 6, and Comparative Example 7 were evaluated, and the results are shown as follows.

The short-circuit current density ($J_{sc}$), open-circuit voltage ($V_{oc}$), fill factor (FF), and power conversion efficiency (PCE) of each of the solar cells according to Example 3 and Comparative Examples 6 and 7 are summarized and shown in Table 1 below.

TABLE 1

| | Forward/Reverse direction | $J_{sc}$ (mA/cm$^2$) | $V_{oc}$ (V) | FF (%) | PCE (%) |
|---|---|---|---|---|---|
| Comparative Example 6 | Forward | 4.04 | 0.82 | 19.10 | 0.63 |
| | Reverse | 4.40 | 0.84 | 17.46 | 0.65 |
| Comparative Example 7 | Forward | 22.19 | 0.87 | 45.94 | 8.87 |
| | Reverse | 21.45 | 0.86 | 41.17 | 7.62 |
| Example 3 | Forward | 23.13 | 1.10 | 64.81 | 16.49 |
| | Reverse | 22.90 | 1.10 | 71.98 | 18.13 |

Referring to Table 1, it can be confirmed that the solar cell of Example 3 has higher short-circuit current density, open-circuit voltage, fill factor, and power conversion efficiency than the solar cell of Comparative Example 6.

That is, when the second semiconductor layer including the NiO nanoparticle from which the organic ligand is removed is formed as in Example 3, the perovskite photoactive layer is less damaged, and thus the efficiency of the solar cell of Example 3 may be improved.

In addition, it can be confirmed that the short-circuit current density values of the solar cell of Example 3 and the solar cell of Comparative Example 7 are almost the same, but the solar cell of Example 3 has higher open-circuit voltage, fill factor, and power conversion efficiency than the solar cell of Comparative Example 7.

That is, due to the NiO nanoparticle, the short-circuit current density value of Comparative Example 7 may be almost the same as the short-circuit current density value of Example 3. However, due to the NiO nanoparticle ink having low dispersibility, the number of NiO nanoparticles included in the second semiconductor layer of Comparative Example 7 is smaller than that of Example 3, and thus Comparative Example 7 has lower open-circuit voltage, fill factor, and power conversion efficiency than Example 3.

To evaluate the heat stability of the perovskite solar cells manufactured in Example 3 and Comparative Example 9, the solar cells of Example 3 and Comparative Example 9 were placed on a hot plate at 85° C. under nitrogen atmosphere, and efficiency reduction rate was analyzed for 1,000 hours.

As a result, the solar cell using, as a hole transport layer, the Spiro-OMeTAD monomolecular organic material manufactured in Comparative Example 9 exhibits an efficiency reduction of 90% or more within 200 hours. On the other hand, the solar cell using, as a hole transport layer, the NiO inorganic oxide layer manufactured in Example 3 exhibits an efficiency reduction of less than 10% for 1,000 hours.

According to an embodiment of the present disclosure, a metal oxide nanoparticle without an organic ligand can be prepared, and by dispersing the prepared metal oxide nanoparticle in a dispersion solvent, highly dispersible metal oxide nanoparticle ink can be prepared.

According to an embodiment of the present disclosure, when metal oxide nanoparticle ink including a crystallized metal oxide nanoparticle is prepared, and is applied to a photoelectric device, a crystallized thin film can be formed at low temperature without heat treatment.

According to an embodiment of the present disclosure, when metal oxide nanoparticle ink including a metal oxide nanoparticle without an organic ligand is prepared, and is applied to a photoelectric device, deterioration in the electrical properties of the photoelectric device due to the insulating organic ligand can be prevented.

According to an embodiment of the present disclosure, when highly dispersible metal oxide nanoparticle ink is prepared, and a charge transport layer is applied to a photoelectric device, various types of metal oxide nanoparticles can be included compared to the prior art.

According to an embodiment of the present disclosure, metal oxide nanoparticle ink including a dispersion solvent and a metal oxide nanoparticle without an organic ligand is prepared and used, a charge transport layer can be formed without damage to the upper surface of a photoactive layer composed of a perovskite compound.

According to an embodiment of the present disclosure, by applying metal oxide nanoparticle ink to a photoelectric device, a uniform and dense thin film can be formed without damage to a photoactive layer composed of a perovskite compound.

According to an embodiment of the present disclosure, by applying metal oxide nanoparticle ink to a photoelectric device, the stability of the photoelectric device can be excellent.

Although the present disclosure has been described through limited examples and figures, the present disclosure is not intended to be limited to the examples. Those skilled in the art will appreciate that various modifications, additions, and substitutions are possible, without departing from the scope and spirit of the invention. Therefore, the scope of the present disclosure should not be limited by the embodiments, but should be determined by the following claims and equivalents to the following claims.

What is claimed is:

1. Metal oxide nanoparticle ink, comprising:
   a metal oxide nanoparticle from which an organic ligand has been removed; and
   a dispersion solvent for dispersing the metal oxide nanoparticle,
   wherein the dispersion solvent comprises a solvent, and the dispersion solvent satisfies Equations 1 and 2 below representing a Hansen solubility sphere:

$$R_a^2 = 4(\delta D_2 - \delta D_1)^2 + 1(\delta P_2 - \delta P_1)^2 + 1(\delta H_2 - \delta H_1)^2, \quad \text{[Equation 1]}$$

wherein Ra represents a distance (radius) from the dispersion solvent to a volumetric center of the metal oxide nanoparticle, Subscript 1 represents the dispersion solvent, Subscript 2 represents the metal oxide nanoparticle, δD represents a dispersion solubility parameter, δP represents a polar solubility parameter, and δH represents a hydrogen-binding solubility parameter; and $$\text{Relative energy difference (RED)} = R_a/R_0, \quad \text{[Equation 2]}$$

wherein Ra represents a distance (radius) from the dispersion solvent to a volumetric center of the metal oxide nanoparticle, and $R_0$ represents an interaction distance (radius of Hansen solubility sphere) between the dispersion solvent and the metal oxide nanoparticle comprising the dispersion solvent for dissolving or dispersing the metal oxide nanoparticle,
   wherein the metal oxide nanoparticle is nickel oxide (NiO),
   wherein the dispersion solvent comprises at least one of butanol, chlorobenzene, benzene, chloroform, and diethyl ether,
   wherein the dispersion solvent comprises a polar solvent and a nonpolar solvent, wherein the polar and nonpolar solvents are mixed in a volume ratio of 1:9 to 9:1, and
   wherein the metal oxide nanoparticle is dispersed in the metal oxide nanoparticle ink at a concentration of 20 mg/mL to 50 mg/mL.

2. Metal oxide nanoparticle ink according to claim 1, wherein the metal oxide nanoparticle has a diameter of 3 nm to 10 nm.

* * * * *